United States Patent
Kim et al.

(10) Patent No.: US 9,142,724 B2
(45) Date of Patent: Sep. 22, 2015

(54) NITRIDE-BASED SEMICONDUCTOR LIGHT-EMITTING DEVICE

(71) Applicant: SAMSUNG ELECTRONICS CO., LTD., Suwon-si, Gyeonggi-do (KR)

(72) Inventors: Jung-sub Kim, Hwaseong-si (KR); Jin-sub Lee, Suwon-si (KR); Cheol-soo Sone, Seoul (KR); Kyung-wook Hwang, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 3 days.

(21) Appl. No.: 13/973,720

(22) Filed: Aug. 22, 2013

(65) Prior Publication Data

US 2014/0183546 A1     Jul. 3, 2014

(30) Foreign Application Priority Data

Dec. 28, 2012    (KR) .................. 10-2012-0157333

(51) Int. Cl.
H01L 33/32      (2010.01)
H01L 33/38      (2010.01)
H01L 33/40      (2010.01)

(52) U.S. Cl.
CPC .............. *H01L 33/38* (2013.01); *H01L 33/405* (2013.01)

(58) Field of Classification Search
CPC ........ H01L 33/38; H01L 33/405; H01L 33/20
USPC .......... 257/99, 98, 79, 81; 438/22, 26, 29, 46, 438/597
See application file for complete search history.

(56) References Cited

U.S. PATENT DOCUMENTS

| | | | | |
|---|---|---|---|---|
| 6,258,618 B1 * | 7/2001 | Lester | .............................. | 438/46 |
| 6,998,649 B2 * | 2/2006 | Hata | ............................... | 257/99 |
| 7,057,212 B2 * | 6/2006 | Kim et al. | ........................ | 257/98 |
| 7,138,665 B2 * | 11/2006 | Okazaki et al. | .................. | 257/98 |
| 7,279,718 B2 * | 10/2007 | Krames et al. | ................... | 257/98 |
| 7,485,897 B2 * | 2/2009 | Seong et al. | .................... | 257/81 |
| 7,893,451 B2 * | 2/2011 | Cho et al. | ......................... | 257/98 |
| 8,101,964 B2 * | 1/2012 | Kitagawa et al. | ............... | 257/99 |
| 8,476,670 B2 * | 7/2013 | Kim et al. | ..................... | 257/103 |
| 8,592,954 B2 * | 11/2013 | Emura et al. | .................. | 257/632 |

(Continued)

FOREIGN PATENT DOCUMENTS

| | | |
|---|---|---|
| JP | 2004-006970 A | 1/2004 |
| KR | 2005-0091579 A | 9/2005 |

(Continued)

OTHER PUBLICATIONS

Hui-Youn Shin et al., "Formation Characteristics of Inversion Domains in P-GaN and P-AlGaN Layers by Using TEM Observation," Journal of the Korean Physical Society, vol. 53, No. 6, Dec. 2006, pp. 3399-3403.

*Primary Examiner* — Jaehwan Oh
(74) *Attorney, Agent, or Firm* — McDermott Will & Emery LLP

(57) ABSTRACT

A nitride-based semiconductor light-emitting device includes an n-type nitride-based semiconductor layer, an active layer, a p-type nitride-based semiconductor layer, an ohmic contact layer covering a portion of the p-type nitride-based semiconductor layer upper surface, and a p electrode including a first portion contacting the p-type nitride-based semiconductor layer and a second portion contacting the ohmic contact layer.

13 Claims, 10 Drawing Sheets

(56) References Cited

U.S. PATENT DOCUMENTS

| | | | |
|---|---|---|---|
| 8,835,954 B2 * | 9/2014 | Fujimoto et al. | 257/98 |
| 2002/0063256 A1 * | 5/2002 | Lin | 257/79 |
| 2003/0141507 A1 * | 7/2003 | Krames et al. | 257/79 |
| 2005/0051786 A1 * | 3/2005 | Okazaki et al. | 257/98 |
| 2005/0156185 A1 * | 7/2005 | Kim et al. | 257/99 |
| 2005/0184305 A1 * | 8/2005 | Ueda | 257/99 |
| 2006/0049417 A1 * | 3/2006 | Li et al. | 257/96 |
| 2007/0155032 A1 * | 7/2007 | Kim et al. | 438/22 |
| 2009/0079322 A1 * | 3/2009 | Tsutsumi et al. | 313/349 |
| 2009/0212278 A1 * | 8/2009 | Jorgenson et al. | 257/13 |
| 2009/0242925 A1 * | 10/2009 | Kitagawa et al. | 257/99 |
| 2009/0261372 A1 * | 10/2009 | Ueda | 257/98 |

FOREIGN PATENT DOCUMENTS

| | | |
|---|---|---|
| KR | 10-0619415 B1 | 8/2006 |
| KR | 10-1103639 B1 | 1/2012 |

\* cited by examiner 720  710  720

740  730  740

NITRIDE-BASED SEMICONDUCTOR LIGHT-EMITTING DEVICE

CROSS-REFERENCE TO RELATED APPLICATIONS

This application claims the benefit of Korean Patent Application No. 10-2012-0157333, filed on Dec. 28, 2012, in the Korean Intellectual Property Office, the disclosure of which is incorporated herein in its entirety by reference.

TECHNICAL FIELD

The disclosure relates to nitride-based semiconductor light-emitting devices, and more particularly, to a nitride-based semiconductor light-emitting device including a nitride-based semiconductor ohmic contact layer.

BACKGROUND

Light-emitting diodes (LEDs) having a wavelength of 200 to 350 nm have been applied to various fields, e.g., sterilization, water purification, various medical fields, decomposition of pollutants, bio engineering, etc. As products using a deep ultraviolet (DUV) LED have evolved, much effort is required to improve the light extraction efficiency (LEE) of the DUV LED.

SUMMARY

The disclosure provides a nitride-based semiconductor light-emitting device having an improved light extraction efficiency (LEE).

According to an aspect of the disclosure, there is provided a nitride-based semiconductor light-emitting device including an n-type nitride-based semiconductor layer. An active layer is formed on the n-type nitride-based semiconductor layer and a p-type nitride-based semiconductor layer formed on the active layer. An ohmic contact layer covers a portion of an upper surface of the p-type nitride-based semiconductor layer on the p-type nitride-based semiconductor layer. A p electrode is formed on the ohmic contact layer, and includes a first portion contacting the p-type nitride-based semiconductor layer and a second portion contacting the ohmic contact layer.

According to another aspect of the disclosure, there is provided a nitride-based semiconductor light-emitting device including an active layer. A first nitride-based semiconductor layer supplies electrons to the active layer when power is supplied to the first nitride-based semiconductor layer. A second nitride-based semiconductor layer supplies holes to the active layer when power is supplied to the second nitride-based semiconductor layer. An ohmic contact layer discontinuously covers an upper surface of the second nitride-based semiconductor layer. An electrode includes a first portion contacting the second nitride-based semiconductor layer, and a second portion contacting the ohmic contact layer.

BRIEF DESCRIPTION OF THE DRAWINGS

Exemplary embodiments of the disclosure will be more clearly understood from the following detailed description taken in conjunction with the accompanying drawings.

DETAILED DESCRIPTION

Hereinafter, exemplary embodiments of the disclosure will be described in greater detail with reference to the accompanying drawings. Like elements refer to like elements throughout and are not redundantly described here.

The disclosure may, however, be embodied in many different forms and should not be construed as limited to the exemplary embodiments. Rather, these embodiments are provided so that this disclosure will be thorough and complete, and will fully convey the scope of the disclosure to those of ordinary skilled in the art.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an embodiment of the disclosure may be embodied differently, a particular process may be performed in an order different from an order described herein. For example, two operations that are continuously described herein may be substantially simultaneously performed or may be performed in an order that is reverse of an order described herein.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

Figure 1:
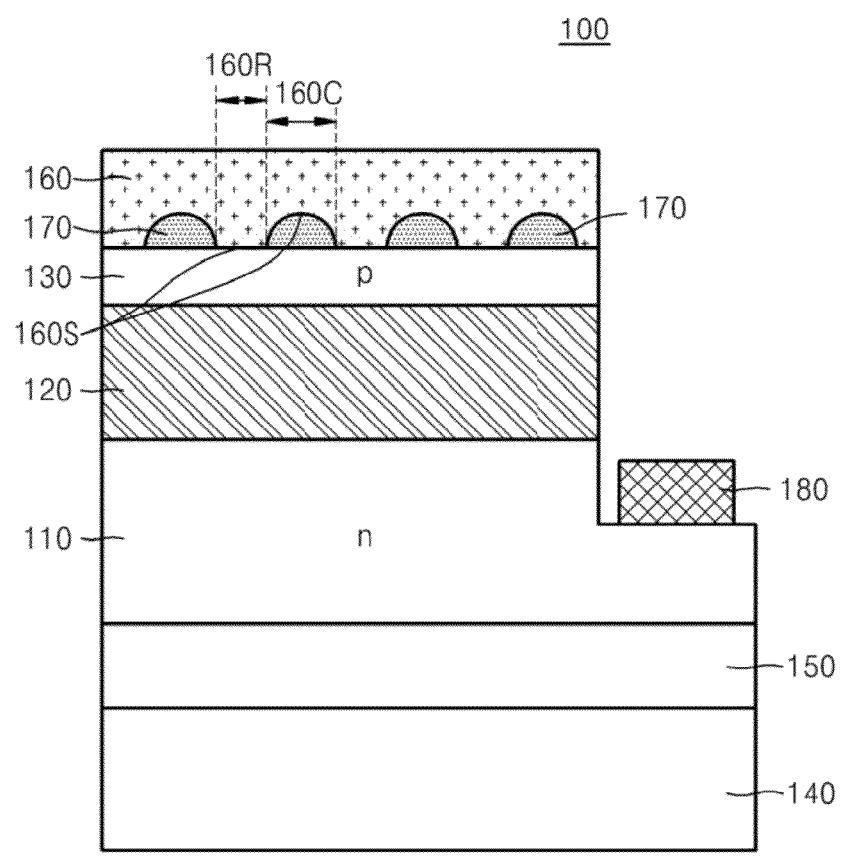
FIG. 1 is a cross-sectional view of a nitride-based semiconductor light-emitting device according to an embodiment of the disclosure.

FIG. 1 is a cross-sectional view of a nitride-based semiconductor light-emitting device 100 according to an embodiment of the disclosure. FIG. 1 illustrates an ultraviolet (UV) light-emitting device that emits light of a UV range but the disclosure is not limited thereto.

Referring to FIG. 1, the nitride-based semiconductor light-emitting device 100 includes an n-type nitride-based semiconductor layer 110, an active layer 120 formed on the n-type nitride-based semiconductor layer 110, and a p-type nitride-based semiconductor layer 130 formed on the active layer 120.

To generate light of a UV range having a wavelength of about 200 to 350 nm in the active layer 120, the n-type nitride-based semiconductor layer 110, the active layer 120, and the p-type nitride-based semiconductor layer 130 may each include an AlGaN compound semiconductor. For example, the n-type nitride-based semiconductor layer 110 may be formed of n-doped AlGaN (n-AlGaN), the active layer 120 may be formed of undoped AlGaN (u-AlGaN), and the p-type nitride-based semiconductor layer 130 may be formed of p-doped AlGaN (p-AlGaN). An aluminum (Al) composition ratio in each of the n-type nitride-based semiconductor layer 110 and the p-type nitride-based semiconductor layer 130 may be 50% or more. The Al composition ratio in the active layer 120 may be lower than those in the n-type nitride-based semiconductor layer 110 and the p-type nitride-based semiconductor layer 130. For example, the Al composition ratio in the active layer 120 may be 30% or more and 50% or less.

The n-type nitride-based semiconductor layer 110 that supplies electrons to the active layer 120 when power is supplied thereto may include impurities consisting of group IV elements that are n-type impurities. In some embodiments, the n-type nitride-based semiconductor layer 110 may include Si, Ge, Se, or Te impurities. In some embodiments, the n-type nitride-based semiconductor layer 110 may be formed on a substrate 140 by metal-organic chemical vapor deposition (MOCVD), hydride vapor phase epitaxy (HYPE), or molecular beam epitaxy (MBE).

The substrate 140 may be a transparent substrate for growing a Group III-V semiconductor layer. For example, the substrate 140 may be formed of a material selected from the group consisting of sapphire, Si, GaN, glass, ZnO, GaAs, SiC, MgAl$_2$O$_4$, MgO, LiAlO$_2$, and LiGaO$_2$. When the substrate 140 is formed of sapphire, the substrate 140 may include a crystallographic plane, e.g., a C-plane ((0001) plane), an A-plane ((1120) plane), or an M-plane ((1102) plane). The C-plane sapphire substrate may provide stable characteristics at high temperatures, and it is easy to form a nitride thin film thereon.

When the n-type nitride-based semiconductor layer 110 is formed of AlGaN, a buffer layer 150 may be formed on the substrate 140, and the n-type nitride-based semiconductor layer 110 may be grown on the buffer layer 150. The buffer layer 150 is formed between the substrate 140 and the n-type nitride-based semiconductor layer 110 to lessen a lattice mismatch between the substrate 140 and the n-type nitride-based semiconductor layer 110. In some embodiments, the buffer layer 150 may be a single layer formed of MN or GaN. In some embodiments, the buffer layer 150 may include superlattice layers formed of AlGaN/AlN.

The active layer 120 emits light with predetermined energy when electrons and holes are combined therein with one another. The active layer 120 may have a structure in which a quantum well layer and a quantum barrier layer are alternately stacked at least once. The quantum well layer may have a single quantum well structure or a multi-quantum well structure. In some embodiments, the active layer 120 may be formed of u-AlGaN. In some embodiments, the active layer 120 may have a multi-quantum well structure including GaN/AlGaN, InAlGaN/InAlGaN, or InGaN/AlGaN. To improve the luminance efficiency of the active layer 120, the depth of a quantum well, the number of stacked pairs of quantum well layers and quantum barrier layers, the thicknesses of the stacked pairs of the quantum well layer and the quantum bather layer, etc. may be changed. In some embodiments, the active layer 120 may be formed by MOCVD, HYPE, or MBE.

The p-type nitride-based semiconductor layer 130 that supplies power to the active layer 120 when power is supplied thereto may include impurities formed of group II elements, which are p-type impurities. In some embodiments, the p-type nitride-based semiconductor layer 130 may include Mg, Zn, or Be impurities. In some embodiments, the p-type nitride-based semiconductor layer 130 may be formed by MOCVD, HYPE, or MBE.

A p electrode 160 is formed on the p-type nitride-based semiconductor layer 130. The p electrode 160 contacts a portion of an upper surface of the p-type nitride-based semiconductor layer 130. The p electrode 160 may reflect light emitted from the active layer 120. The p electrode 160 may be formed of a metal or an alloy having high reflectivity in a UV range having a wavelength of about 350 nm or less. In some embodiments, the p electrode 160 may include aluminum (Al) or an Al alloy. The Al alloy may include Al, and a metal having a higher work function than Al. In some embodiments, the p electrode 160 may include Al, and at least one metal selected from the group consisting of Ni, Au, Ag, Ti, Cr, Pd, Cu, Pt, Sn, W, Rh, Ir, Ru, Mg, and Zn. In some embodiments, the p electrode 160 may include a lower electrode film for improving ohmic contact, and an upper electrode film formed on the lower electrode film. For example, the lower electrode film may include at least one metal selected from the group consisting of Ni, Au, Ag, Ti, and Cr. The upper electrode film may include Al. At least one of the lower electrode film and the upper electrode film may be formed of an alloy layer or a combination of a single metal layer and an alloy layer.

An ohmic contact layer 170 is formed in a region between the p-type nitride-based semiconductor layer 130 and the p electrode 160. The ohmic contact layer 170 may be formed of a p-type nitride-based semiconductor layer. For example, the ohmic contact layer 170 may be formed of p-GaN or p-InGaN.

When the p-type nitride-based semiconductor layer 130 includes an AlGaN layer, the AlGaN layer has higher activation energy than a GaN layer that does not include Al. Even if p-type impurities are implanted into the AlGaN layer, the doped concentration of the p-type impurities may be lower than in the GaN layer. In particular, the more the content of Al in the AlGaN layer, the lower the doped concentration of the p-type impurities in the AlGaN layer may be. In this case, by forming the ohmic contact layer 170 between the p-type nitride-based semiconductor layer 130 and the p electrode 160, problems caused when an efficiency of doping p-type impurities in the p-type nitride-based semiconductor layer 130 is lowered may be compensated for.

A concavo-convex structure corresponding to the outline of the ohmic contact layer 170 is formed on a surface 160S of the p electrode 160 on the ohmic contact layer 170, which faces the active layer 120. The surface 160S of the p electrode 160 includes a first portion 160R contacting the p-type nitride-based semiconductor layer 130 and a second portion 160C contacting the ohmic contact layer 170 for the flow of current through the ohmic contact. In the surface 160S of the p electrode 160, the second portion 160C is recessed compared to the first portion 160R.

In the first portion 160R, light emitted from the active layer 120 and passing through the p-type nitride-based semiconductor layer 130 may be reflected directly from the first portion 160R without passing through the ohmic contact layer 170. In the second portion 160C, ohmic contact may be formed with the ohmic contact layer 170, the light emitted from the active layer 120 and passing through the p-type nitride-based semiconductor layer 130 may pass through the ohmic contact layer 170 to be reflected from the p electrode 160, and a portion of the light may be absorbed by the ohmic contact layer 170 while the light passes through the ohmic contact layer 170.

The n-type nitride-based semiconductor layer 110 is connected to an n electrode 180 through which power is supplied from the outside. The n electrode 180 is disposed such as it faces a direction that the p electrode 160 faces. The n electrode 180 may include a single metal film selected from the group consisting of Ni, Al, Au, Ti, Cr, Ag, Pd, Cu, Pt, Sn, W, Rh, Ir, Ru, Mg, and Zn, or a multi-layered film or an alloy film formed of a combination thereof.

FIGS. 2A to 2D are plan views of modified examples of the ohmic contact layer 170 included in the nitride-based semiconductor light-emitting device 100, according to embodiments of the disclosure.

Figure 2A:
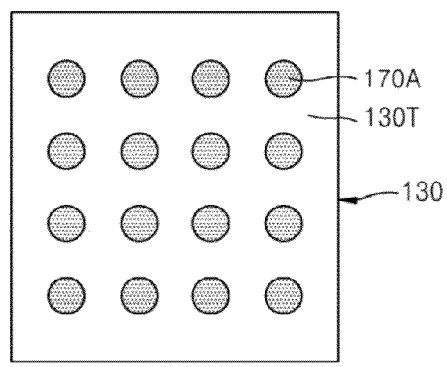
FIGS. 2A to 2D are plan views of modified examples of an ohmic contact layer included in a nitride-based semiconductor light-emitting device, according to embodiments of the disclosure.

Referring to FIG. 2A, the ohmic contact layer 170 may include a plurality of contact region islands 170A. FIG. 2A illustrates that the plurality of contact region islands 170A have a uniform shape and are arranged at the same interval but the disclosure is not limited thereto. In some embodiments, the plurality of contact region islands 170A may have different sizes and shapes, and may be arranged at different intervals. Through regions between the plurality of contact region islands 170A, an upper surface 130T of the p-type nitride-based semiconductor layer 130 and the ohmic contact layer 170 may contact each other.

Figure 2B:
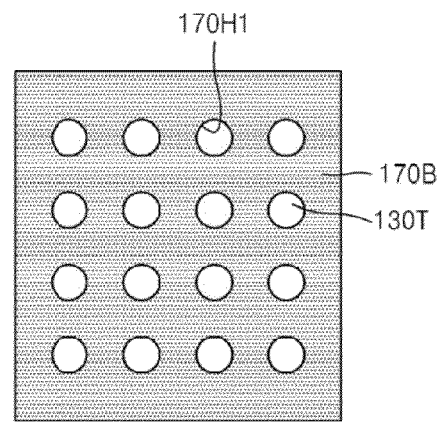

Referring to FIG. 2B, the ohmic contact layer 170 may be formed of a thin film 170B in which a plurality of holes 170H1 are formed. FIG. 2B illustrates that the plurality of holes 170H1 have a uniform shape and are arranged at the same interval but the disclosure is not limited thereto. In some embodiments, the plurality of holes 170H1 may have different sizes and shapes, and may be arranged at different intervals. Through the plurality of holes 170H1, the upper surface 130T of the p-type nitride-based semiconductor layer 130 and the ohmic contact layer 170 may contact each other.

Figure 2C:
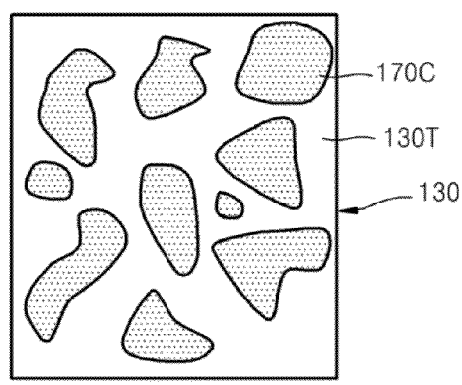
Figure 2D:
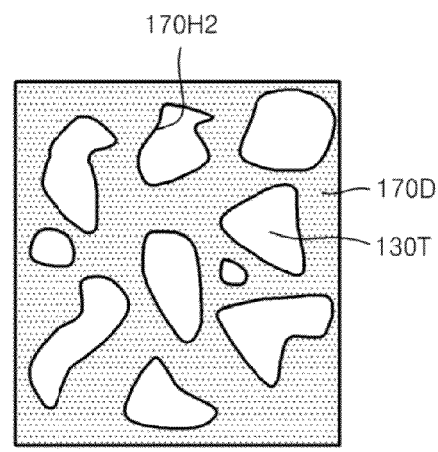

Referring to FIG. 2C, the ohmic contact layer 170 may include a plurality of contact region islands 170C having different shapes and sizes. Through regions between the plurality of contact region islands 170C, the upper surface 130T of the p-type nitride-based semiconductor layer 130 and the ohmic contact layer 170 may contact each other. Referring to FIG. 2D, the ohmic contact layer 170 may be formed of a thin film 170D in which a plurality of holes 170H2 having different shapes and sizes are formed. Through the plurality of holes 170H2, the upper surface 130T of the p-type nitride-based semiconductor layer 130 and the ohmic contact layer 170 may contact each other. However, the shape of the ohmic contact layer 170 is not limited to that illustrated in any of FIGS. 2A to 2D, and may have any of various shapes and various sizes. In some embodiments, the ohmic contact layer 170 may have a structure that is a combination of the structures illustrated in FIGS. 2A to 2D. For example, some regions of the ohmic contact layer 170 may include both a plurality of contact region islands and a thin film including a plurality of holes.

However, the shape of the ohmic contact layer 170 is not limited to that illustrated in any of FIGS. 2A to 2D, and may have any of various shapes and various sizes. In some embodiments, the ohmic contact layer 170 may have a structure that is a combination of the structures illustrated in FIGS. 2A to 2D. For example, some regions of the ohmic contact layer 170 may include both a plurality of contact region islands and a thin film including a plurality of holes.

The ohmic contact layer 170 may be formed to cover at least 15% of the area of the upper surface 130T of the p-type nitride-based semiconductor layer 130. For example, the ohmic contact layer 170 may be formed to cover about 15 to 80% of the area of the upper surface 130T of the p-type nitride-based semiconductor layer 130 but it is not limited thereto.

Figure 3A:
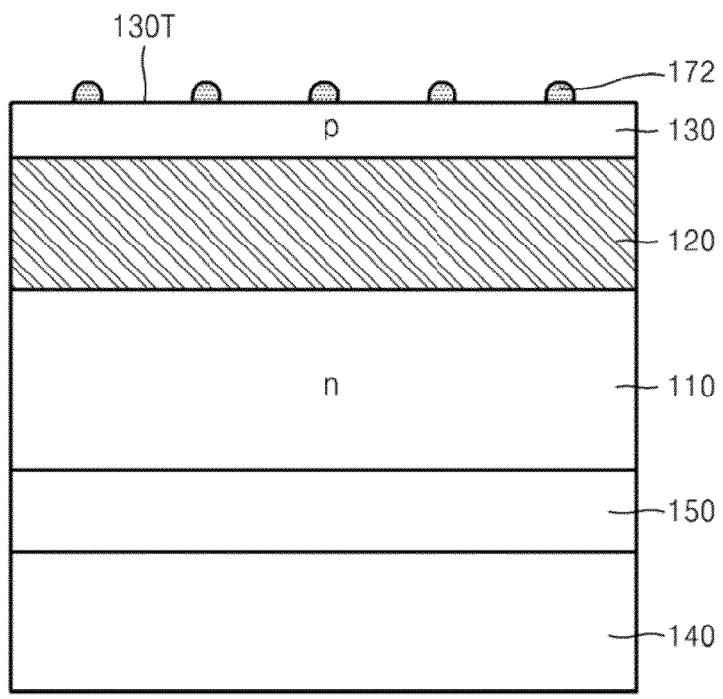
FIGS. 3A to 3C are cross-sectional views sequentially illustrating a process of forming an ohmic contact layer included in a nitride-based semiconductor light-emitting device, according to an embodiment of the disclosure.
Figure 3B:
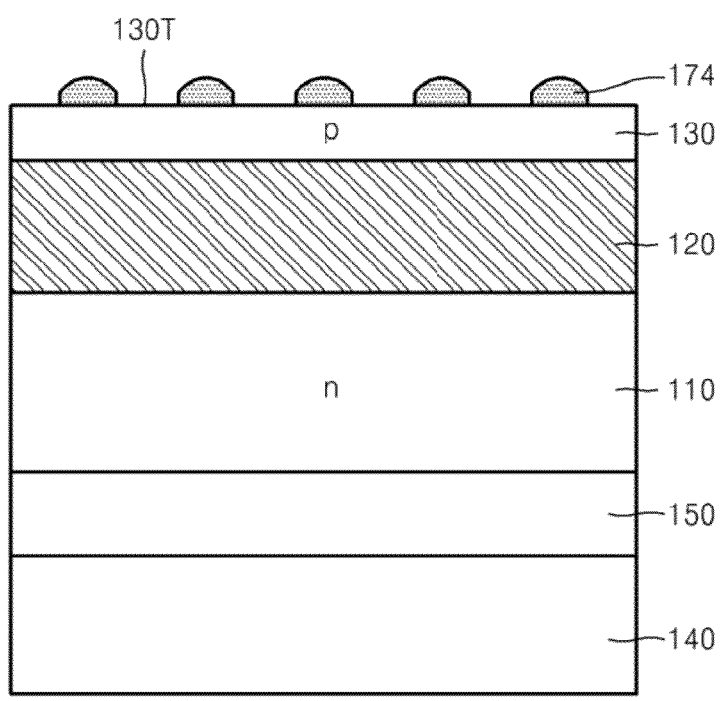
Figure 3C:
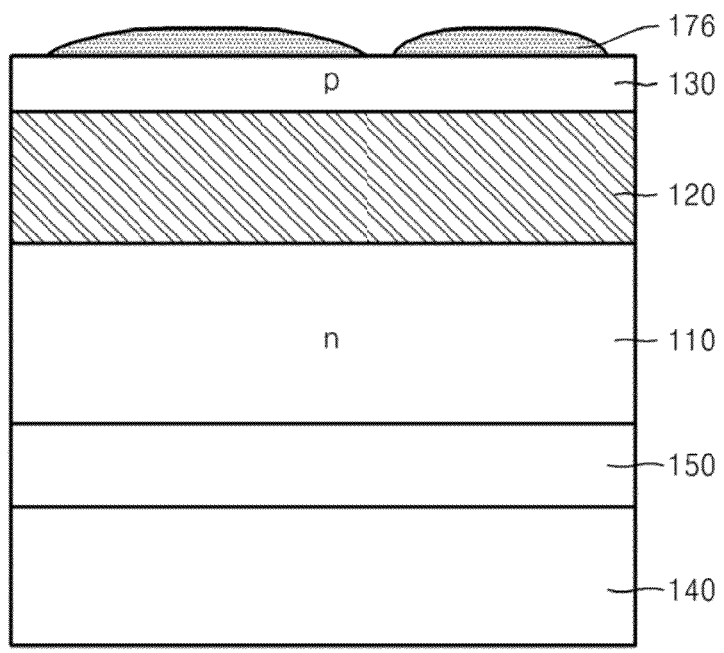

FIGS. 3A to 3C are cross-sectional views sequentially illustrating a process of forming the ohmic contact layer 170 on the upper surface 130T of the p-type nitride-based semiconductor layer 130, according to an embodiment of the disclosure. In FIGS. 3A to 3C, reference numerals that are the same as those in FIG. 1 denote the same elements and are thus not described again here for convenience of explanation.

FIGS. 3A to 3C illustrate an example of a process of forming the ohmic contact layer 170 formed of p-GaN.

Referring to FIG. 3A, a buffer layer 150, an n-type nitride-based semiconductor layer 110, an active layer 120, and a p-type nitride-based semiconductor layer 130 are sequentially formed on a substrate 140, and a plurality of p-GaN island layers 172 are then formed on an upper surface 130T of the p-type nitride-based semiconductor layer 130.

To form p-GaN island layers 172, p-GaN may be grown on the upper surface 130T of the p-type nitride-based semiconductor layer 130 by MOCVD while supplying a Ga source, an N source, a dopant source, and a carrier gas to the upper surface 130T. In some embodiments, trimethyl gallium or triethyl gallium may be used as the Ga source. $NH_3$, $NH_4OH$, monomethylamine, dimethylamine, diethylamine, tert-butylamine, a hydrazine-based material, or derivatives thereof may be used as the N source. bis(cyclopentadienyl)magnesium ($Cp_2Mg$) or bis(methylcyclopentadienyl)magnesium [$(MeCp)_2Mg$)] may be used as the dopant source. $H_2$, $N_2$, He, Ne, Ar, or a combination thereof may be used as the carrier gas.

While the p-GaN is grown to form the ohmic contact layer 170, a process temperature of about 900 to 1300° C. and a process pressure of about 5 to 50 KPa may be maintained. For example, a process of growing the p-GaN to form the ohmic contact layer 170 may be performed at about 1000 to 1200° C. under about 10 to 20 KPa.

During the growing of the p-GaN to form the ohmic contact layer 170, a feed molar ratio between the N source gas and the Ga source gas may be about 100:1 to 10000:1. For example, the supply mole ratio between the N source gas and the Ga source gas may be about 1000:1 to 3000:1.

In some embodiments, each of the N source gas and the Ga source gas may be continuously supplied during the growing of the p-GaN to form the ohmic contact layer 170. In some embodiments, at least one of the N source gas and the Ga source gas may be supplied in a pulsed mode in which gas supply is repeatedly switched between 'on' and 'off' at predetermined time intervals.

During the growing of the p-GaN to form the ohmic contact layer 170, a process time may be controlled to adjust sizes and heights of p-GaN islands that constitute the ohmic contact layer 170. Also, by controlling the process time, an area of the upper surface 130T of the p-type nitride-based semiconductor layer 130 that is covered by p-GaN islands constituting the ohmic contact layer 170 may be adjusted.

During the process of growing the p-GaN to form the ohmic contact layer 170, an island growth operation of forming the plurality of p-GaN island layers 172 (see FIG. 3A), a lateral growth operation of laterally growing the plurality of p-GaN island layers 172 to obtain a plurality of expanded p-GaN layers 174 (see FIG. 3B), and a fusing operation of fusing at least some of the plurality of expanded p-GaN layers 174 by continuously laterally growing the plurality of expanded p-GaN layers 174 to obtain at least one fused p-GaN layer 176 (see FIG. 3C) may be performed.

As illustrated in FIG. 3A, in the island growth operation of forming the plurality of p-GaN island layers 172, since a lattice constant of a material used to form the plurality of p-GaN island layers 172 is higher than that of a material used to form the p-type nitride-based semiconductor layer 130, p-GaN may be first grown in a direction perpendicular to the upper surface 130T of the p-type nitride-based semiconductor layer 130 when the plurality of p-GaN island layers 172 are formed.

In some embodiments, MOCVD used to form the ohmic contact layer 170 may be performed until the island growth operation illustrated in FIG. 3A is performed. In this case, the ohmic contact layer 170 may cover about 50% of an area of the upper surface 130T of the p-type nitride-based semiconductor layer 130, In some embodiments, MOCVD used to form the ohmic contact layer 170 may be performed until the lateral grown operation illustrated in FIG. 3B is performed. In this case, the ohmic contact layer 170 may include the plurality of expanded p-GaN layers 174. Also, the area of the ohmic contact layer 170 covering the upper surface 130T of the p-type nitride-based semiconductor layer 130 may be larger than in the island growth operation described with reference to FIG. 3A.

In some embodiments, MOCVD used to form the ohmic contact layer 170 may be performed until the fusing operation illustrated in FIG. 3C is performed. In this case, the area of the ohmic contact layer 170 covering the upper surface 130T of the p-type nitride-based semiconductor layer 130 may be larger than in the lateral grown operation described with reference to FIG. 3B.

Figure 4A:
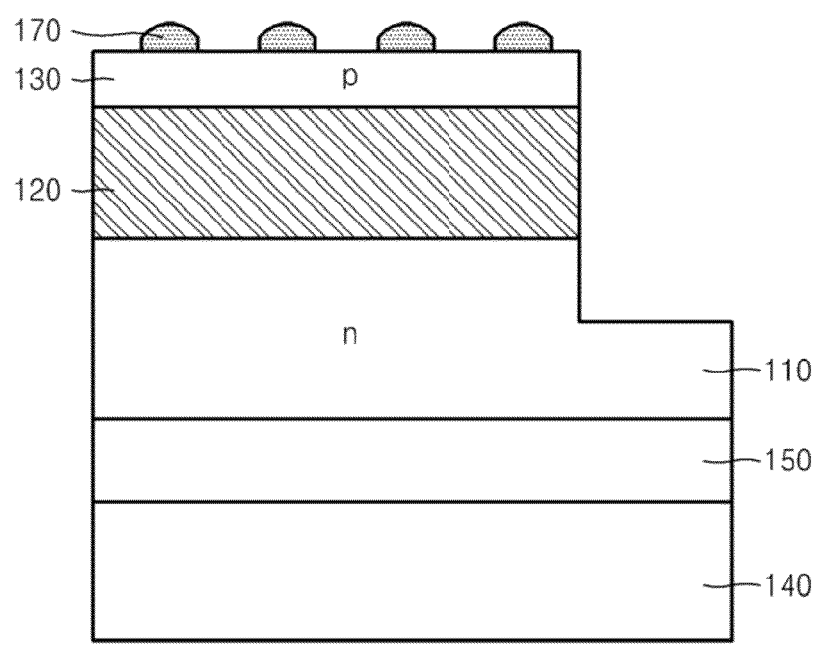
FIGS. 4A and 4B are cross-sectional views sequentially illustrating a process of forming a nitride-based semiconductor light-emitting device of FIG. 1, according to an embodiment of the disclosure.
Figure 4B:
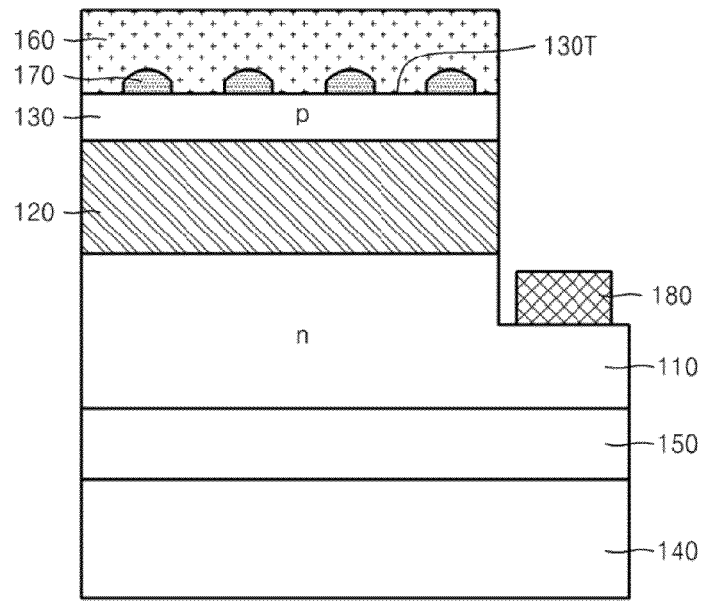

FIGS. 4A and 4B are cross-sectional views sequentially illustrating a process of forming the nitride-based semiconductor light-emitting device 100 of FIG. 1, according to an embodiment of the disclosure.

A case in which a subsequent process is performed on the resultant structure of FIG. 3B will be described as an example of the process of forming the nitride-based semiconductor light-emitting device 100 of FIG. 1 with reference to FIGS. 4A and 4B. In FIGS. 4A and 4B, reference numerals that are the same as in FIG. 1 denote the same elements and are thus not described again here for convenience of explanation.

Referring to FIG. 4A, an ohmic contact layer 170 is formed by forming a plurality of expanded p-GaN layers 174 on a p-type nitride-based semiconductor layer 130, and the resultant structure is mesa-etched to expose a portion of the n-type nitride-based semiconductor layer 110.

Referring to FIG. 4B, a p electrode 160 is formed to cover an upper surface 130T of the p-type nitride-based semiconductor layer 130 and the ohmic contact layer 170. Then, an n electrode 180 is formed on the exposed n-type nitride-based semiconductor layer 110. An order in which the p electrode 160 and the n electrode 180 are formed is not limited. For example, the n electrode 180 may be formed after the p electrode 160 is formed, or the p electrode 160 may be formed after the n electrode 180 is formed.

Figure 5:
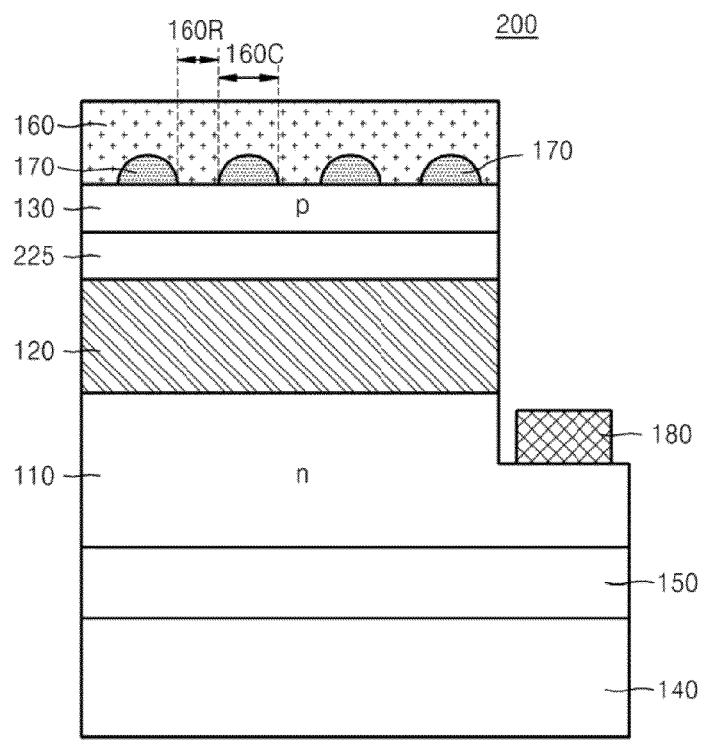
FIG. 5 is a cross-sectional view of a nitride-based semiconductor light-emitting device according to another embodiment of the disclosure.

FIG. 5 is a cross-sectional view of a nitride-based semiconductor light-emitting device 200 according to another embodiment of the disclosure. In FIG. 5, reference numerals that are the same as in FIG. 1 denote the same elements and are not described again here for convenience of explanation. The nitride-based semiconductor light-emitting device 200 has substantially the same structure as that of the nitride-based semiconductor light-emitting device 100 of FIG. 1, except that an electron-blocking layer 225 is disposed between an active layer 120 and a p-type nitride-based semiconductor layer 130.

The electron-blocking layer 225 is used to increase an internal quantum efficiency of a light-emitting device, and may be formed of a material with high band gap energy. A band gap of the electron-blocking layer 225 may be higher than that of the active layer 120.

Figure 6:
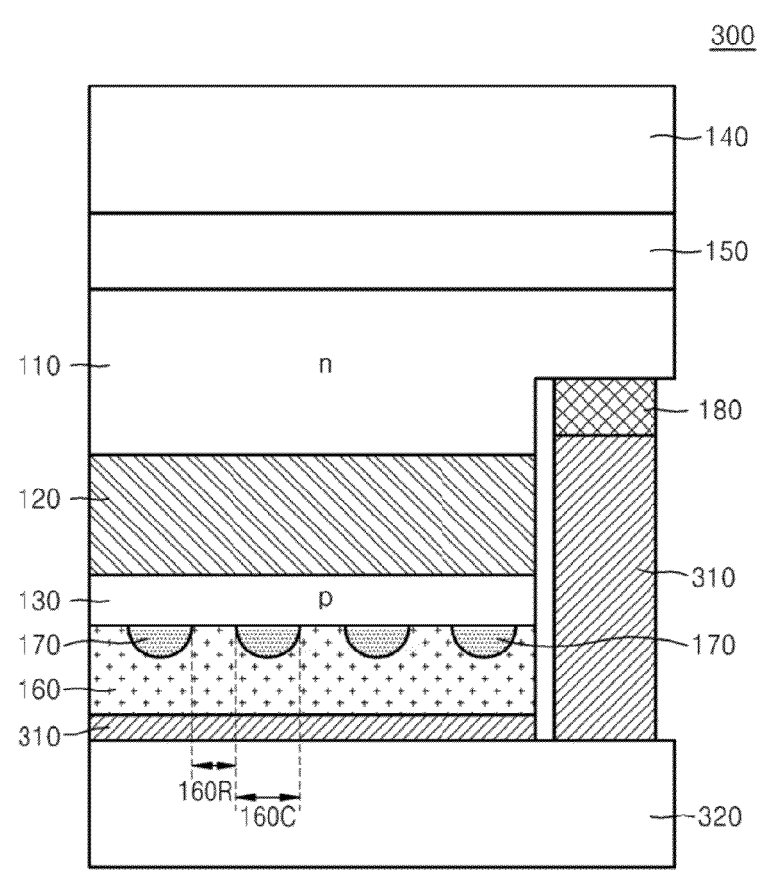
FIG. 6 is a cross-sectional view of a nitride-based semiconductor light-emitting device according to another embodiment of the disclosure.

In some embodiments, the electron-blocking layer 225 may be formed of AlGaN. Here, the Al composition ratio in the electron-blocking layer 225 may be adjusted such that the electron-blocking layer 225 has higher band gap energy than that of the active layer 120. For example, the Al composition ratio in the electron-blocking layer 225 may be about 50% or more. The electron-blocking layer 225 may prevent electrons flowing into the active layer 120 from the n-type nitride-based semiconductor layer 110 from being over-flown to the p-type nitride-based semiconductor layer 130 on the active layer 120 without being reunited in the active layer 120, and may cause the electrons to be bound in the active layer 120, thereby increasing a rate of reuniting electrons and holes in the active layer 120. FIG. 6 is a cross-sectional view of a nitride-based semiconductor light-emitting device 300 according to another embodiment of the disclosure. FIG. 6 illustrates the nitride-based semiconductor light-emitting device 300 having a horizontal structure in which flip-chips are mounted. In FIG. 6, reference numerals that are the same as in FIG. 1 denote the same elements and are not described again here for convenience of explanation. Referring to FIG. 6, in the nitride-based semiconductor light-emitting device 300, a p electrode 160 and an n electrode 180 are connected to a submount 320 via a conductive adhesive layer 310.

The conductive adhesive layer 310 may include a thin film or stud bumps. In some embodiments, the conductive adhesive layer 310 may be formed of Au, Sn, Ag, Cu, Al, Ni, Ti, Pd, Pt, W, Cr, Rh, Ir, Ru, Mg, Zn, or a combination thereof but it is not limited thereto.

The submount 320 may be formed of a material having high thermal conductivity. In some embodiments, the submount 320 may be formed of Si but is not limited thereto.

In some embodiments, the nitride-based semiconductor light-emitting device 300 may not include a substrate 140. In some embodiments, a concavo-convex pattern (not shown) may be formed on a portion of a surface of the substrate 140. When the concavo-convex pattern is formed on the substrate 140, a light extraction efficiency may increase due to diffused reflection of light from the surface of the substrate 140, thereby improving the light extraction efficiency of the nitride-based semiconductor light-emitting device 300. In some embodiments, after the nitride-based semiconductor light-emitting device 300 is formed, the substrate 140 and a buffer layer 150 may be removed, and a concavo-convex pattern (not shown) may then be formed on at least a portion of an exposed surface of an n-type nitride-based semiconductor layer 110, thereby increasing light extraction efficiency.

In the nitride-based semiconductor light-emitting device 300, light emitted from the active layer 120 has no directionality. The light emitted from the active layer 120 toward the p electrode 160 may be reflected from the p electrode 160 and may then be extracted through the substrate 140. The p electrode 160 includes a first portion 160R directly contacting the p-type nitride-based semiconductor layer 130, in which an ohmic contact layer 170 is not disposed between the first portion 160R and the p-type nitride-based semiconductor layer 130, and a second portion 160C contacting the ohmic contact layer 170. Thus, the light emitted toward the p electrode 160 from the active layer 120 is reflected from the p electrode 160 in a path in which the light passes through the ohmic contact layer 170 before or after the light arrives at the p electrode 160 and a path in which the light does not pass through the ohmic contact layer 170 before or after the light arrives at the p electrode 160. Thus, all the light emitted toward the p electrode 160 from the active layer 120 does not pass through the ohmic contact layer 170, and light reflected directly from the first portion 160R without passing through the ohmic contact layer 170 may be extracted in a direction of the substrate 140. As described above, the larger the area of the first portion 160R, the more the amount of the light reflected directly from the first portion 160R without passing through the ohmic contact layer 170.

A portion of the light passing through the ohmic contact layer 170 may be absorbed by the ohmic contact layer 170. For example, when the ohmic contact layer 170 is formed of p-GaN having a thickness of about 100 to 200 nm, about 80% of the light passing through the ohmic contact layer 170 or more may be absorbed by the ohmic contact layer 170. When light generated in the active layer 120 passes through the ohmic contact layer 170, arrives at the p electrode 160, is reflected from the p electrode 160, and then passes through the ohmic contact layer 170 again, the light extraction efficiency may be lowered by about 10% or less. However, in the nitride-based semiconductor light-emitting device 300 according to an embodiment of the disclosure, at least a portion of light generated in the active layer 120 does not pass through the ohmic contact layer 170 until the light is reflected from the first portion 160R of the p-type nitride-based semiconductor layer 130 and is then extracted through the substrate 140. Thus, an optical loss caused when the light is absorbed by the ohmic contact layer 170 may be reduced, thereby increasing the light extraction efficiency.

Figure 7:
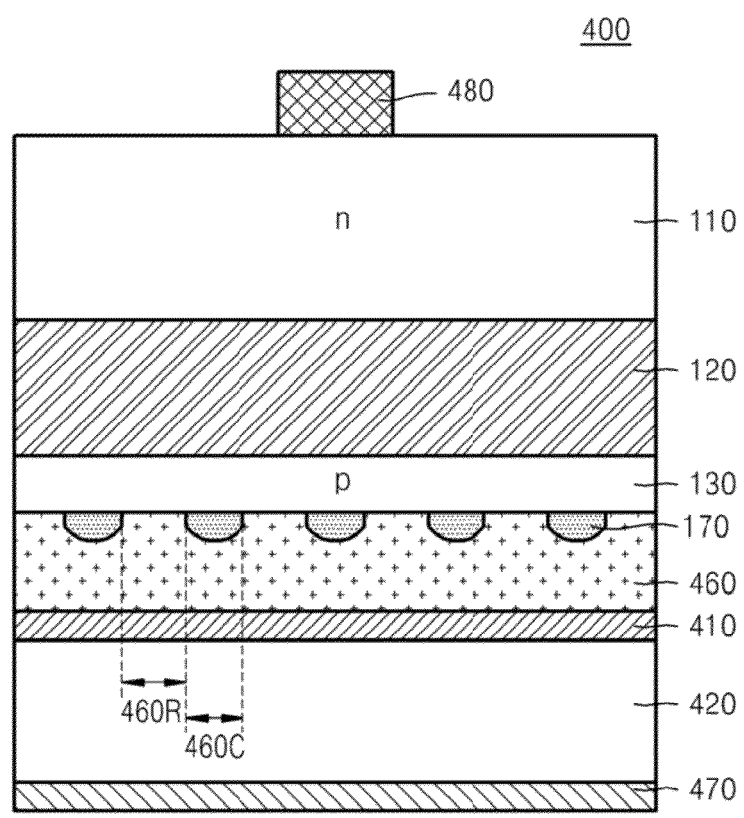
FIG. 7 is a cross-sectional view of a nitride-based semiconductor light-emitting device according to another embodiment of the disclosure.

FIG. 7 is a cross-sectional view of a nitride-based semiconductor light-emitting device 400 according to another embodiment of the disclosure. FIG. 7 illustrates the nitride-based semiconductor light-emitting device 400 having a vertical structure in which a p electrode 460 and an electrode 470 connected to the p electrode 460, and an n electrode 480 are disposed to face different directions. In FIG. 7, reference numerals that are the same as in FIG. 1 denote the same elements and are thus not described again here for convenience of explanation.

Referring to FIG. 7, in the nitride-based semiconductor light-emitting device 400, the p electrode 460 is connected to a receptor substrate 420 via a conductive adhesive layer 410. The electrode 470 is formed on a surface of the receptor substrate 420 that is opposite to another surface of the receptor substrate 420 facing the p electrode 460.

The details of the p electrode 460 are substantially the same as those of the p electrode 160 described above with reference to FIG. 1. The details of the conductive adhesive layer 410 are substantially the same as those of the conductive adhesive layer 310 described above with reference to FIG. 6. The receptor substrate 420 may be formed of SiC, ZnO, GaN, Al, Cu, Si, SiAl, or a combination thereof but it is not limited thereto.

In a process of forming the nitride-based semiconductor light-emitting device 400 according to an embodiment of the disclosure illustrated in FIG. 7, a buffer layer 150, an n-type nitride-based semiconductor layer 110, an active layer 120, and a p-type nitride-based semiconductor layer 130 are sequentially formed on a substrate 140, and an ohmic contact layer 170 is formed on the p-type nitride-based semiconductor layer 130 as described above with reference to FIGS. 3A and 3B. In some embodiments, the ohmic contact layer 170 may include a plurality of expanded p-GaN island layers 174 of FIG. 3B. Then, a p electrode 460 is formed to cover an upper surface 130T of the p-type nitride-based semiconductor layer 130 and the ohmic contact layer 170. Then, the receptor substrate 420 is connected to the p electrode 460 via the conductive adhesive layer 410. Then, the n-type nitride-based semiconductor layer 110 is exposed by removing the substrate 140 and the buffer layer 150 using laser lift-off or chemical lift-off. Then, an n electrode 480 is formed on an exposed surface of the n-type nitride-based semiconductor layer 110. The n electrode 480 and the p electrode 460 are disposed to face different directions.

In the nitride-based semiconductor light-emitting device 400, light generated in the active layer 120 may be emitted without having directionality, and light emitted toward the p electrode 460 may be reflected from the p electrode 460 and be then discharged to the outside via the n-type nitride-based semiconductor layer 110. The p electrode 460 includes a first portion 460R directly contacting the p-type nitride-based semiconductor layer 130, in which the ohmic contact layer 170 is not disposed between the p electrode 460 and the p-type nitride-based semiconductor layer 130, and a second portion 460C contacting the ohmic contact layer 170. Thus, at least a part of the light generated in the active layer 120 does not pass through the ohmic contact layer 170 until the light is reflected from the first portion 460R of the p electrode 460 and is then extracted in a direction of the n-type nitride-based semiconductor layer 110. Accordingly, an optical loss caused when the light is absorbed by the ohmic contact layer 170 may be reduced, thereby improving light extraction efficiency.

Figure 8:
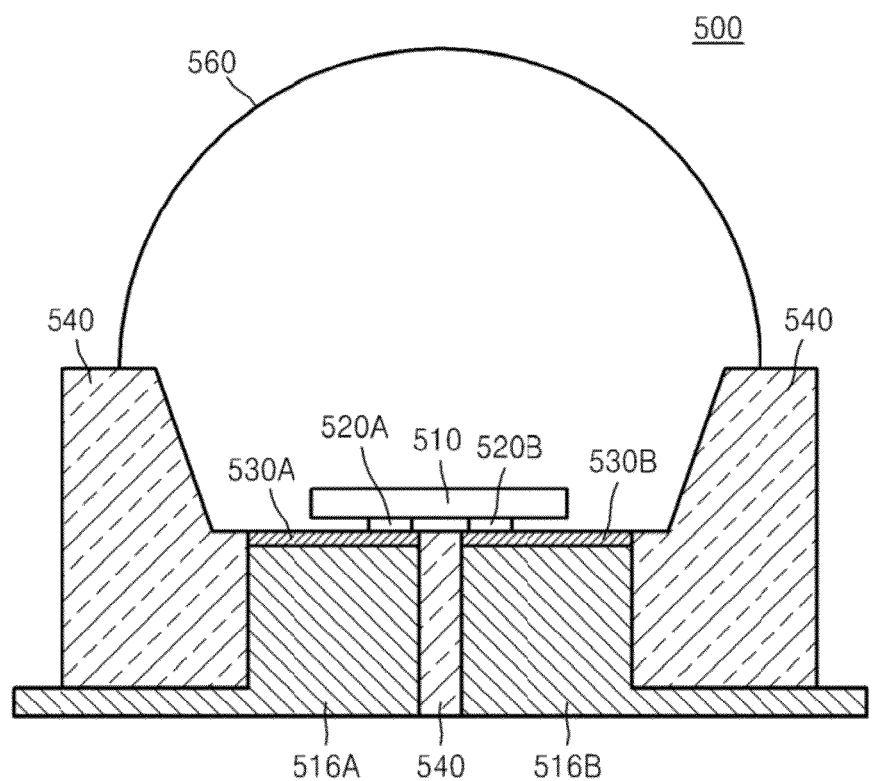
FIG. 8 is a cross-sectional view of a semiconductor light-emitting device package according to an embodiment of the disclosure.

FIG. 8 is a cross-sectional view of a semiconductor light-emitting device package 500 according to an embodiment of the disclosure. Referring to FIG. 8, the semiconductor light-emitting device package 500 includes a light-emitting device 510, and a first electrode 516A and a second electrode 516B that are disposed below the light-emitting device 510 and to which the light-emitting device 510 is attached.

Here, the light-emitting device 510 may include the nitride-based semiconductor light-emitting device 100 of FIG. 1. The light-emitting device 510 may be formed by flip-chip bonding the nitride-based semiconductor light-emitting device 100 to the first electrode 516A and the second electrode 516B. To this end, each of the p electrode 160 and the n electrode 180 of the nitride-based semiconductor light-emitting device 100 may be connected to one of the first electrode 516A and the second electrode 516B.

The first electrode 516A and the second electrode 516B may be separated from each other to not only apply a voltage to the light-emitting device 510 but also radiate heat generated from the light-emitting device 510. A first bonding layer 520A is disposed between the light-emitting device 510 and the first electrode 516A, and a second bonding layer 520B is disposed between the light-emitting device 510 and the second electrode 516B. Each of the first bonding layer 520A and the second bonding layer 520B may be formed of Au, In, Pb, Sn, Cu, Ag, a combination thereof, or an alloy thereof. In some embodiments, the light-emitting device 510 may be adhered onto the first electrode 516A and the second electrode 516B via a conductive adhesive, instead of the first bonding layer 520A and the second bonding layer 520B.

A reflective layer 530A and a reflective layer 530B are respectively coated on upper surfaces of the first electrode 516A and the second electrode 516B to reflect light generated in the light-emitting device 510 to be emitted toward an upper portion of the light-emitting device 510. In some embodiments, the reflective layers 530A and 530B may be each formed of Ag or Al.

The first electrode 516A and the second electrode 516B are supported by a package housing 540. The package housing 540 may be formed of a material that is stable at high temperatures or a heat resistant insulating material such as ceramic. A portion of the package housing 540 disposed between the first electrode 516A and the second electrode 516B electrically insulates the first electrode 516a and the second electrode 516b from each other.

The light-emitting device 510 is encapsulated with a lens 560. In some embodiments, the lens 560 is used to concentrate light generated in the light-emitting device 510, and may be formed of sapphire, silica, or calcium fluoride. The lens 560 may be adhered on the substrate 140 of the nitride-based semiconductor light-emitting device 100 by PMMA. In some embodiments, a lens-type fluorescent layer (not shown) may be disposed instead of the lens 560.

Figure 9:
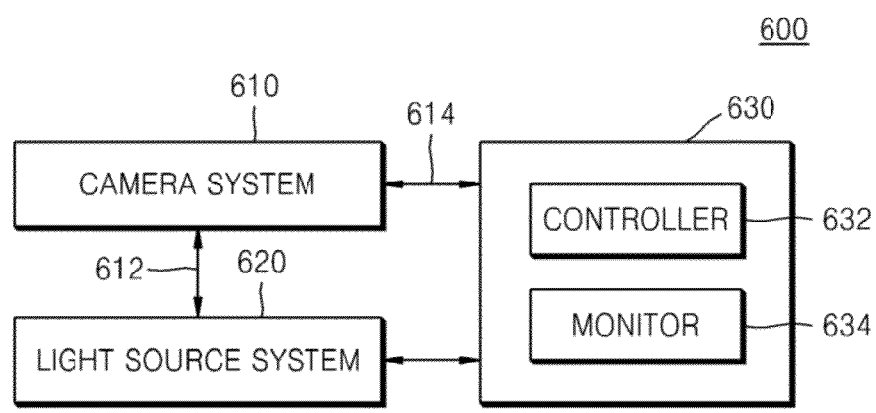
FIG. 9 is a block diagram of an light process system according to an embodiment of the disclosure.

FIG. 9 is a block diagram of a light process system 600 according to an embodiment of the disclosure. Referring to FIG. 9, the light process system 600 includes a camera system 610, a light source system 620, and a data process and analysis system 630. The camera system 610 may be disposed toward an object to be optically processed while the camera system 610 directly contacts or is spaced a predetermined distance from the object. In some embodiments, the object may be human tissue such as skin or a part of a human body to be cured. The camera system 610 is connected to the light source system 620 via a light guide 612. The light guide 612 may include an optical fiber light guide or a liquid light guide via which light is transmitted.

The light source system 620 provides light to be irradiated on the object that is to be optically processed, via the light guide 612. The light source system 620 includes at least one among the nitride-based semiconductor light-emitting devices 100, 200, 300, and 400 described above with reference to FIGS. 1 and 5 to 7, and the semiconductor light-emitting device package 500 described above with reference to FIG. 8. Light irradiated by the light source system 620 may have a wavelength of about 200 to 350 nm. In some embodiments, the light source system 620 may generate or oscillate UV light, and irradiate the UV light on the skin of or a diseased region of a human body.

The camera system 610 is connected to the data process and analysis system 630 via a cable 614. An image signal output from the camera system 610 may be transmitted to the data process and analysis system 630 via the cable 614. The data process and analysis system 630 includes a controller 632 and a monitor 634. The data process and analysis system 630 may process, analyze, and store the image signal received from the camera system 610.

The light process system 600 of FIG. 9 may be applied to various fields of, for example, skin diagnosis, medical treatment appliances, sterilization systems, cleansing apparatuses, surgery goods, cosmetic medical appliances, illumination apparatuses, information sensing apparatuses, etc.

Evaluation Example

To manufacture a UV LED, a series of operations were performed by MOCVD, as follows: First, an MN buffer layer was grown to a thickness of about 400 nm on a C-plane sapphire substrate within a MOCVD reaction chamber maintained at about 1200° C. under a pressure of about 5 KPa, and a Si-doped n-AlGaN layer (Al composition rate: 55 at %) was grown to a thickness of about 2 μm on the AlN buffer layer while maintaining the temperature and pressure. Then, an active layer, including an AlGaN layer (Al composition rate: 40 at %) and an AlGaN layer (Al composition rate: 55 at %), was grown. Then, a Mg-doped p-AlGaN layer (Al composition rate: 55 at %) having a thickness of about 30 nm was grown on the active layer.

Then, a p-GaN layer was formed on the p-AlGaN layer by MOCVD under various process conditions. In this case, trimethyl gallium (TMGa) was used as a Ga source, ammonia ($NH_3$) was used as an N source, and bis(cyclopentadienyl) magnesium ($Cp_2Mg$) was used as a dopant source. Also, $H_2$ gas was used as a carrier gas. Here, the N source gas and the Ga source gas were continuously supplied during a deposition process of forming the p-GaN layer.

Figure 10A:
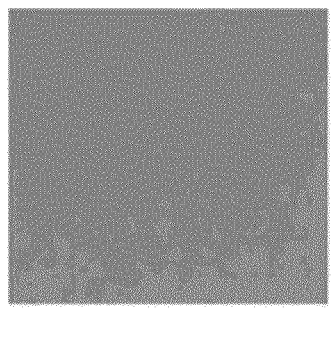
FIG. 10A is an optical microscope image of a surface of a p-GaN layer.

FIG. 10A is an optical microscope image of a surface of a p-GaN layer formed as a thin film having a roughly even thickness of about 380 nm by MOCVD, under conditions that about 900° C. and about 20 KPa were maintained and a feed molar ratio between an N source gas and a Ga source gas was set to about 1000:1.

Figure 10B:
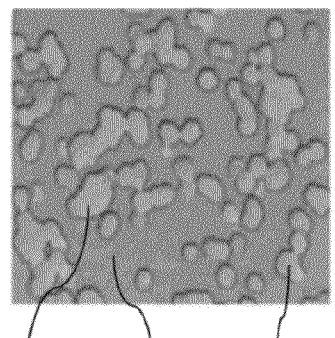
FIG. 10B is an optical microscope image of a surface of a p-GaN layer that may be included in a nitride-based semiconductor light-emitting device according to an embodiment of the disclosure.

FIG. 10B is an optical microscope image of a surface of a plurality of p-GaN layers 720 obtained by growing the plurality of p-GaN layers 720 by MOCVD, under conditions that about 1200° C. and about 20 KPa were maintained and a feed molar ratio between an N source gas and a Ga source gas was set to about 2000:1.

Referring to FIG. 10B, either the plurality of p-GaN layers 720 were each grown on a p-AlGaN layer 710 in an island shape or adjacent p-GaN layers 720 among the plurality of p-GaN layers 720 are fused and grown in an expanded island shape to discontinuously cover the surface of the p-AlGaN layer 710.

An area ratio of the plurality of p-GaN layers 720 covering the p-AlGaN layer 710 may be controlled by adjusting a time of growing the plurality of p-GaN layers 720 under process conditions for obtaining the result of FIG. 10B. Portions of the p-AlGaN layer 710 that are not covered by the plurality of p-GaN layers 720, i.e., the area of the AlGaN layer 710 to contact an electrode during a subsequent process, may be optimized as described above.

Figure 10C:
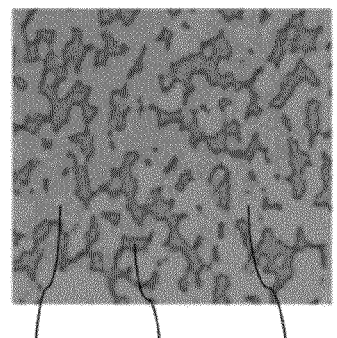
FIG. 10C is an optical microscope image of a surface of a p-GaN layer that may be included in a nitride-based semiconductor light-emitting device according to another embodiment of the disclosure.

FIG. 10C is an optical microscope image of a surface of a p-GaN layer 740 obtained by growing the p-GaN layer 740 on a p-AlGaN layer 730 under the process conditions used to obtain the result of FIG. 10B, except that a feed molar ratio between an N source gas and a Ga source gas was set to about 1000:1.

Referring to FIG. 10C, the p-GaN layer 740 was formed to discontinuously cover the p-AlGaN layer 730 by lowering the feed molar ratio between the N source gas and the Ga source gas, and was observed as having a flatter upper surface than the p-GaN layer 720 of FIG. 10B. As described above, when the p-GaN layer 740 has such a flat upper surface, a metal deposition process may be easily performed to form an electrode on the p-GaN layer 740.

When a p-GaN was formed by growing the p-GaN layer on a p-AlGaN layer under the process conditions applied to evaluation of the result of FIG. 10B, the coverage (%) of the p-GaN on the p-AlGaN layer was calculated as a time of growing the p-GaN layer elapsed, and the light extraction efficiencies and device efficiencies of UV LEDs having various coverages were evaluated and shown in Table 1.

TABLE 1

| | Coverage (%) | | | | | | | | |
|---|---|---|---|---|---|---|---|---|---|
| | 0 | 7 | 16 | 29 | 40 | 57 | 70 | 82 | 100 |
| Light extraction efficiency (%) | 30 | 25 | 20 | 15 | 12 | 10 | 7 | 5 | 3 |
| Device efficiency (%) | 0 | 1.8 | 3.2 | 4.4 | 4.8 | 5.7 | 4.9 | 4.1 | 2.9 |

Table 1 shows that the device efficiencies when the p-GaN layer covers about 16 to 82% of an upper surface of the p-AlGaN layer were higher than when the p-GaN layer entirely covers an upper surface of the p-AlGaN layer (when coverage=100%).

While the disclosure has been particularly shown and described with reference to exemplary embodiments thereof, it will be understood that various changes in form and details may be made therein without departing from the spirit and scope of the following claims.

What is claimed is:

1. A nitride-based semiconductor light-emitting device comprising:
    an n-type nitride-based semiconductor layer;
    an active layer formed on the n-type nitride-based semiconductor layer;
    a p-type nitride-based semiconductor layer formed on the active layer;
    an ohmic contact layer comprising a p-type nitride-based semiconductor covering a portion of an upper surface of the p-type nitride-based semiconductor layer on the p-type nitride-based semiconductor layer, wherein the ohmic contact layer has a thickness of about 100 to 200 nm and covers about 16 to 82% of the upper surface of the p-type nitride-based semiconductor layer; and
    a p electrode formed on the ohmic contact layer, the p electrode including a first portion contacting the p-type nitride-based semiconductor layer and a second portion contacting the ohmic contact layer.

2. The device of claim 1, wherein the ohmic contact layer is formed of p-GaN or p-InGaN.

3. The device of claim 1, wherein the ohmic contact layer comprises a film including a plurality of contact region islands, and
    the p-type nitride-based semiconductor layer and the ohmic contact layer contact each other via regions between the plurality of contact region islands.

4. The device of claim 3, wherein the plurality of contact region islands have different shapes from one another.

5. The device of claim 1, wherein the ohmic contact layer comprises a thin film in which a plurality of holes are formed, and
    wherein the p-type nitride-based semiconductor layer and the ohmic contact layer contact each other via the plurality of holes.

6. The device of claim 5, wherein the plurality of holes have different shapes from one another.

7. The device of claim 1, further comprising an electron-blocking layer disposed between the p-type nitride-based semiconductor layer and the active layer.

8. The device of claim 1, wherein each of the n-type nitride-based semiconductor layer and the p-type nitride-based semiconductor layer comprises an AlGaN layer.

9. The device of claim 1, further comprising a substrate disposed on a surface of the n-type nitride-based semiconductor layer that is opposite to another surface of the n-type nitride-based semiconductor layer facing the active layer; and
    an n electrode connected to the n-type nitride-based semiconductor layer,
    wherein the p electrode and the n electrode are disposed to face a same direction.

10. The device of claim 9, further comprising a buffer layer disposed between the substrate and the n-type nitride-based semiconductor layer to improve a lattice match between the substrate and the n-type nitride-based semiconductor layer.

11. The device of claim 1, further comprising an n electrode disposed on a surface of the n-type nitride-based semiconductor layer that is opposite to another surface of the n-type nitride-based semiconductor layer facing the active layer connected to the n-type nitride-based semiconductor layer,
    wherein the p electrode and the n electrode are disposed facing opposing directions.

12. A nitride-based semiconductor light-emitting device comprising:
    an active layer;
    a first nitride-based semiconductor layer for supplying electrons to the active layer when power is supplied to the first nitride-based semiconductor layer;
    a second nitride-based semiconductor layer for supplying holes to the active layer when power is supplied to the second nitride-based semiconductor layer;
    an ohmic contact layer comprising a p-type nitride-based semiconductor discontinuously covering an upper surface of the second nitride-based semiconductor layer, wherein the ohmic contact layer has a thickness of about 100 to 200 nm and covers about 16 to 82% of the upper surface of the p-type nitride-based semiconductor layer; and
    an electrode including a first portion contacting the second nitride-based semiconductor layer, and a second portion contacting the ohmic contact layer.

13. The device of claim 12, wherein a concavo-convex pattern corresponding to an outline of the ohmic contact layer is formed on a surface of the electrode facing the active layer.

* * * * *